United States Patent [19]
Dumont et al.

[11] Patent Number: 5,268,236
[45] Date of Patent: Dec. 7, 1993

[54] COMPOSITE ALUMINUM PLATE FOR PHYSICAL COATING PROCESSES AND METHODS FOR PRODUCING COMPOSITE ALUMINUM PLATE AND TARGET

[75] Inventors: Christian M. Dumont, Bornheim; Norberg W. Schmitz, Euskirchem, both of Fed. Rep. of Germany; Hans Quaderer, Schaan, Liechtenstein

[73] Assignee: Vereinigte Aluminum-Werke AG, Bonn, Fed. Rep. of Germany

[21] Appl. No.: 703,387

[22] Filed: Jun. 21, 1991

Related U.S. Application Data

[63] Continuation-in-part of Ser. No. 441,866, Nov. 27, 1989, Pat. No. 5,032,468.

[30] Foreign Application Priority Data

Nov. 25, 1988 [DE] Fed. Rep. of Germany ....... 3839775

[51] Int. Cl.$^5$ .............................................. B32B 15/00
[52] U.S. Cl. .................................. 428/636; 428/650; 428/654; 428/925; 428/926; 428/933
[58] Field of Search ............... 428/636, 650, 654, 925, 428/926, 933

[56] References Cited

U.S. PATENT DOCUMENTS

| | | | |
|---|---|---|---|
| 2,383,511 | 8/1945 | Reynolds | 29/189 |
| 2,984,902 | 5/1961 | Bothmann et al. | 428/654 |
| 3,285,717 | 11/1966 | Fischer | 428/650 |
| 3,878,871 | 4/1975 | Anthony et al. | 138/140 |
| 5,032,468 | 7/1991 | Dumont et al. | 428/636 |

FOREIGN PATENT DOCUMENTS

| | | |
|---|---|---|
| 59-179784 | 10/1984 | Japan . |
| 63-270460 | 11/1988 | Japan . |
| 63-319143 | 12/1988 | Japan .................................. 428/654 |
| 176375 | 4/1989 | Japan . |
| 87/02712 | 5/1987 | PCT Int'l Appl. . |

OTHER PUBLICATIONS

*Journal of Applied Physics*, vol. 51, No. 1, Jan. 1980, pp. 718-725, American Institute of Physics, N.Y., U.S.A.
*Metals Handbook*, Properties and Selections; Nonferrous Alloys and Pure Metals, 9th Edition, vol. 2, 1979, pp. 113-123, American Society for Metals, Ohio, U.S.A.

*Primary Examiner*—R. Dean
*Assistant Examiner*—Robert R. Koehler
*Attorney, Agent, or Firm*—Darby & Darby

[57] ABSTRACT

A composite aluminum plate suitable for making targets for coating processes, and methods for making them are disclosed. The plate comprises a surface layer of pure aluminum or an alloy of pure aluminum, and a supporting layer made of a hardenable aluminum alloy having a Brinell hardness index HB of at least about 50 after being heat-treated under suitable conditions. The targets made are suitable for physical or sputter coating processes such as cathodic sputtering and magnetron sputtering.

17 Claims, 2 Drawing Sheets

SUPPORTING LAYER 2

SURFACE LAYER 1

20X MAGNIFICATION 1000 um

20X MAGNIFICATION 1000 um

COMPOSITE ALUMINUM PLATE FOR PHYSICAL COATING PROCESSES AND METHODS FOR PRODUCING COMPOSITE ALUMINUM PLATE AND TARGET

This is a continuation-in-part of U.S. application Ser. No. 07/441,866 filed Nov. 27, 1989, now U.S. Pat. No. 5,032,468.

FIELD OF THE INVENTION

This invention relates to a composite aluminum plate, a target suitable for physical coating processes produced from such a plate, and to methods of producing such plate and target.

BACKGROUND OF THE INVENTION

Several processes have been used for physically coating metal surfaces, including aluminum and aluminum alloy surfaces. One method known as cathodic sputtering involves "atomizing" or "bombarding" a suitable target with high energy gas ions, which are accelerated in an electric field. Using cathodic sputtering, the surface atoms are displaced from the target and deposited on the surface to be coated where they form a layer.

In a modification of the cathodic sputtering method, a magnetic field is applied to the target to increase the sputtering rate significantly, according to the Penning principle. This modified cathodic sputtering technique is referred to as magnetron sputtering. In magnetron sputtering, a small portion of the energy which is applied to the target is converted into kinetic energy with the majority of energy transformed into heat. To effectively displace atoms from the surface of the target, the excess heat must be dissipated by intensively cooling the target.

One serious consequence of bombardment heating, arising from, for example, magnetron sputtering, is a marked deterioration in the mechanical stability, including the shape, of the aluminum and aluminum alloy metal target.

To overcome this deterioration in metal stability, and to allow for sputtering with high energy output, prior art teaches composite targets with backing plates, which impart high mechanical stability and good heat conductivity, to improve the physical characteristics of the composite target and its performance during bombardment heating and minimize deformation.

Backing plates taught by the prior art for aluminum and aluminum alloy targets typically consist of copper. The two metals, i.e. aluminum and copper, or aluminum alloy and copper, are normally joined by conventional methods such as gluing, soldering or explosive plating. However, such targets cannot be roll-bonded because, as a practical matter, the thickness of the copper layer in the backing plate cannot exceed 3 mm. Such thicknesses, i.e. thinner than 3 mm, limit the degree of mechanical stability and resistance to heat deformation which can be imparted to the aluminum or aluminum alloy layer by the copper backing. Thus, such prior art targets which employ copper backings suffer serious disadvantages.

OBJECTS OF THE INVENTION

It is an object of the present invention to provide a two-layered composite aluminum plate comprising an aluminum or aluminum alloy surface layer, and a supporting layer of hardenable aluminum alloy which will harden under suitable conditions, and which is useful to make a target suitable for physical coating processes.

It is a further object of this invention to provide a composite aluminum plate whereby the surface and supporting layers can be joined by roll-bonding even though the supporting layer or backing layer has a thickness exceeding 3 mm.

It is yet a further object of this invention to provide a composite aluminum plate in which a supporting layer is hardenable under suitable heating and precipitating conditions to a Brinell hardness index of at least about 50 and up to 70 or higher.

It is another object of this invention to provide a heat conductive target that is mechanically stable to bombardment heating arising from physical or sputter coating processes, such as cathodic or magnetron sputtering.

It is another object of this invention to provide methods for preparing roll-bondable composite aluminum plates and targets suitable for physical or sputter coating processes produced therefrom with the advantages and features described herein.

These and other objects of the present invention will be apparent to those of ordinary skill in the art in light of the present specification and appended claims.

SUMMARY OF THE INVENTION

It has now been discovered that a composite aluminum plate useful to produce a target for physical coating processes can be prepared in which the layers contained therein can be joined together by roll-bonding. The plate comprises a surface layer melted on the basis of pure aluminum, (Al≧99.99), or a pure aluminum-alloy member melted on a pure aluminum (Al≧99.99) basis; and a supporting layer comprising a hardenable aluminum alloy having a Brinell hardness index (HB) of at least about 50 under suitable heat treatment and curing conditions.

For the pure aluminum alloy in the surface layer, at least one member selected from the group consisting of palladium, vanadium, samarium, zirconium, niobium, molybdenum, hafnium, tungsten, silicon, copper, titanium or chromium, or any combinations of the foregoing, may be employed. For example, aluminum-alloys which may be employed in the surface layer include:

Pure binary alloys, e.g., AlPd, AlV, AlSm, AlZr, AlNb, AlMo, AlHf, AlW, AlCu, AlCr, AlSi and AlTi with total impurities <0.01%; and pure tertiary alloys, e.g., AlSiCu and AlSiTi, with total impurities <0.01%.

For the hardenable aluminum alloy in the supporting layer combinations with silicon, copper, manganese or magnesium, may be employed. For example, AlMgSi, AlCuMg, AlMgSiCu or AlCuMnMg is suitable for use in the support layer.

It has also been discovered that a target suitable for physical or sputter coating processes, such as cathodic sputtering and magnetron sputtering, can be produced by roll-bonding the construction described in this specification at a temperature between about 350° C. and 480° C. The proportion of supporting material preferably constitutes 20–35% of the total thickness.

After roll-bonding with a rolling ratio of at least about 20%, the roll-bonded composite aluminum plate is either heated in a conventional salt bath or in an air furnace at a temperature in the range of from about 450° C. to about 550° C. for less than about 30 minutes, preferably less than 15 minutes. The composite aluminum plate is then quenched (cooled suddenly) in water and subsequently subjected to an artificial aging treatment of 2 to 48 hours at 145° to 180° C. Under these conditions, the supporting layer is hardened so as to enable the target to withstand the bombardment heating stresses of physical or sputter coating procedures applied to the target.

DETAILED DESCRIPTION OF THE INVENTION

The present invention provides a composite aluminum plate useful for making targets for coating processes. The composite plate comprises: a surface layer (1) melted on the basis of pure aluminum, (i.e. $Al \geq 99.99$), or a pure aluminum alloy member melted on pure aluminum ($Al \geq 99.99$) basis; and a supporting layer (2) comprising a hardenable aluminum alloy having a Brinell hardness index (HB) of at least about 50 under suitable heat treatment and curing conditions.

Figure 1:
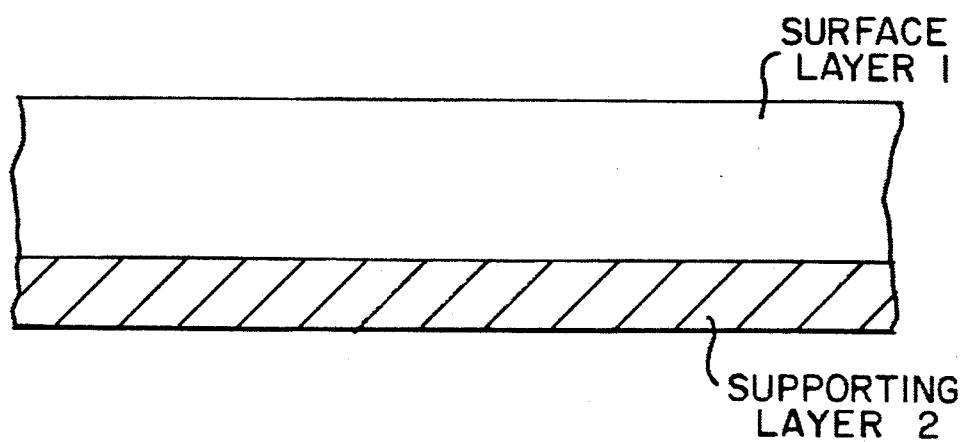
FIG. 1 is an illustration depicting a cross-section through the composite aluminum plate of the present invention.
Figure 2:
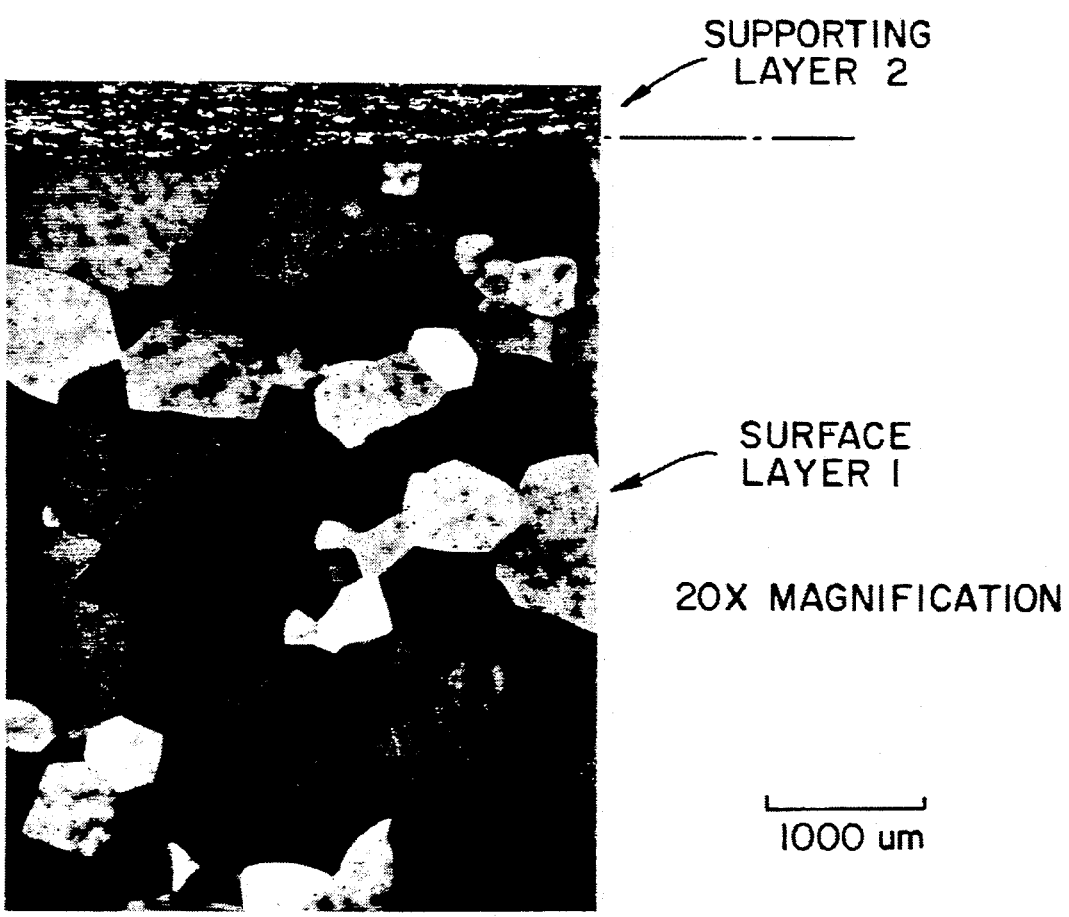
FIGS. 2 and 3 are photographs at 20× magnification showing transverse ground sections of hardened composite aluminum plates produced in accordance with the present invention (see Examples and Table 2).
Figure 3:
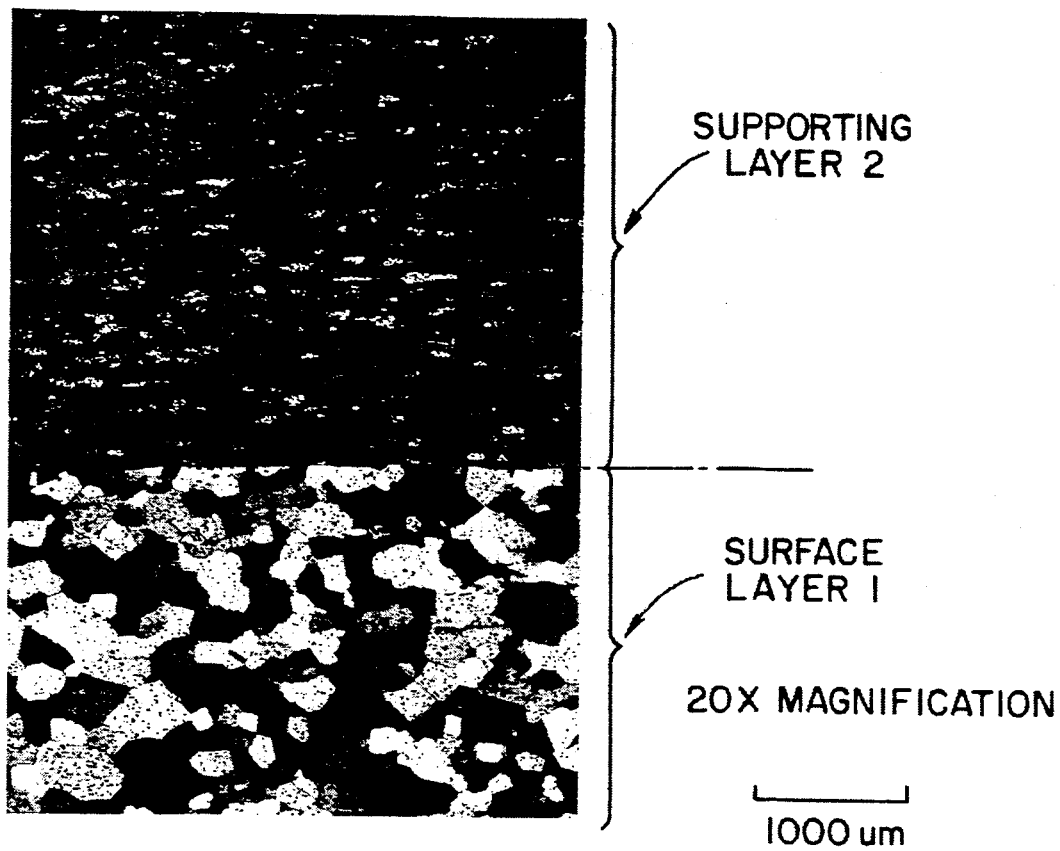
Figure 4:
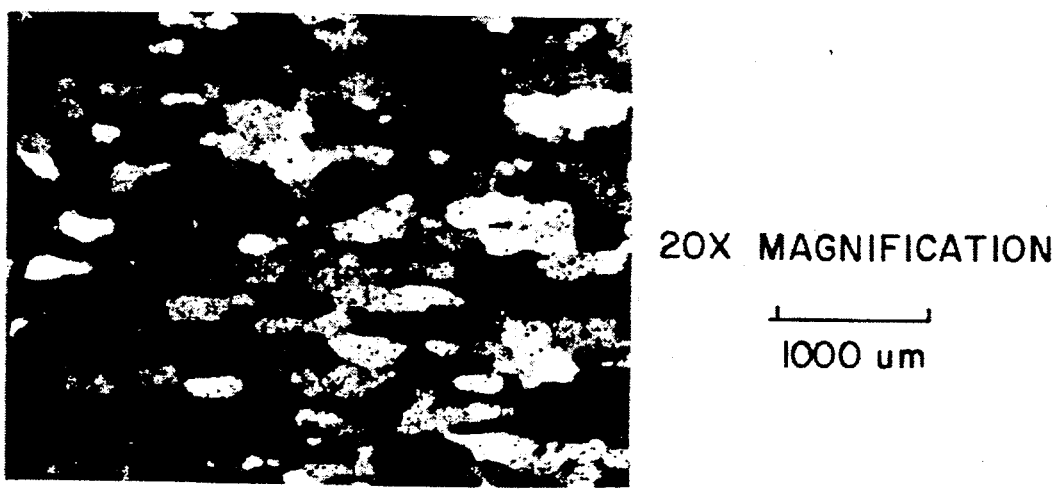
FIG. 4 is a photograph at 20× magnification showing a transverse ground section through the surface layer of the hardened composite aluminum plate of the present invention

The surface layer (1) and the supporting layer (2) are shown in FIGS. 1-3.

Suitable conditions for obtaining the desired Brinell hardness, i.e., hardening conditions, include solution treatment in a salt bath or dry heat treatment in an air furnace at temperatures between about 450° C. and 550° C., preferably between about 470° C. and 500° C. for less than about 30 minutes, preferably less than about 15 minutes and more preferably for between about 3 to 10 minutes; then water quenching followed by aging or curing for between about 2 to 48 hours at a temperature between about 145° to 180° C.

As used herein, the "pure" aluminum contained in the surface layer (1) melted on pure aluminum basis comprises aluminum having a purity of about 99.99 percent or greater (impurities $\leq 0.01$ %). Where an aluminum alloy is contemplated, the aluminum alloy layer is also melted on a pure aluminum basis.

A pure binary alloy, e.g., AlPd, AlV, AlSm, AlZr, AlNb, AlMo, AlHf, AlW, AlCu, AlCr, AlSi or AlTi, with total impurities <0.01%, or a pure ternary alloy, e.g., AlSiCu or AlSiTi, with total impurities <0.01%, can be used.

Preferred as a pure alloy member in the surface layer (1) is silicon. In a preferred embodiment of this invention, as described in the examples below, the surface layer of aluminum comprises a pure silicon binary alloy melted on a pure aluminum basis. For the alloy members, the highest amount contemplated for Si and Ti is about 2%, and for Pd, V, Sm, Zr, Nb, Mo, Hf, W, Cu and Cr, about 4%, of the total surface layer (1) composition.

The supporting layer (2) of the composite aluminum plate comprises a hardenable aluminum alloy having at least one member selected from the group consisting of AlMgSi, AlCuMg AlMgSiCu and AlCuMnMg. Preferred as the aluminum alloy member in the supporting layer (2) is AlMgSi.

Roll-bonding of layers (1) and (2), and the desired characteristics in the final target product such as heat conductivity and mechanical stability, are enhanced when the aluminum or aluminum alloy layer in surface layer (1) has a thickness of from about 5 mm to about 30 mm, preferably from about 8 mm to about 20 mm, and when the supporting layer (2) has a thickness of from about 1 mm to about 15 mm, preferably from about 2 mm to about 10 mm. Additionally, roll-bonding and desired characteristics in the plate and target are enhanced when the supporting layer (2) comprises from about 10 to about 40%, preferably from about 20 to about 35%, of the total thickness of the composite aluminum plate.

The aluminum surface (1) layer and the supporting layer (2) can be roll-bonded by conventional means, using the following protocol. The surface of the parts or layers to be roll-bonded have to be degreased, brushed, joined, heated (in a temperature range of between about 380° C. and 480° C., preferably between about 380° C. and 450° C., more preferably between about 410° C. and 430° C.), and rolled down on a conventional hot rolling mill.

Roll-bonding is carried out by performing repeated roll passes with increasing thickness reduction using a conventional Achenbach rolling mill (Achenbach, Buschhuetten, West Germany). During the roll-bonding operation the aluminum surface layer (1) is heated to a temperature in the range of from about 350° C. to about 480° C., preferably from about 380° C. to about 450° C, more preferably from about 410° C. to about 430° C. The reduction ratio is determined conventionally, for example, from the following formula:

$$\text{Reduction Ratio} = \frac{D_o - D_1}{D_o} \times 100\%$$

where $D_o$=entrance thickness and $D_1$=exit thickness.

As discussed in the Background section of this specification, the surface layer (1) is bombarded with high energy gas ions during sputtering treatment. In order to achieve a uniform removal of surface atoms and consequent extension of its service life, the surface layer (1) must be formed as uniformly and homogeneously as possible, as described herein. For example, if the thickness of the supporting layer (2) is from about 20 to about 35% of the total thickness of the composite aluminum plate, such uniformity and homogeneity can best be achieved when the composite plate is roll-bonded by a degree of rolling of at least about 20% at temperatures ranging from 350° to about 480° C.

When roll-bonded in accordance with the present invention, the roll-bonded composite aluminum plate can next be heat treated by either immersing in a conventional hot salt bath or placed in a dry air furnace. The heat treatment is conducted at a temperature of from about 450° C. to about 550° C., preferably from about 470° C. to about 500° C. for a period of time sufficient to achieve the desired annealing of supporting layer (2).

In general, a heat treatment period of less than about 30 minutes is useful in the practice of this invention. The time required for annealing time is preferably between about 3 and about 30 minutes, i.e., the plate can be either immersed in a hot salt solution or dry heated in a hot air furnace for between about 3 and about 30 minutes. The preferred range of annealing time is between about 5 and about 20 minutes.

Heating the roll-bonded composite aluminum plate to a temperature between about 450° C. to about 550° C., and maintaining this temperature-range, heat treatment for less than about 30 minutes is critical to achieving desirable grain characteristics in the surface layer (1). A globulitic fine grain with an elongation ratio of less than 2 is particularly desirable. Desirable grain characteristics are obtained after heating the roll-bonded composite aluminum plate in accordance with the present invention. The average grain diameter, as measured by the method of Dederichs and Kostron, was less than 1 mm.

Timing is also critical. If the heat treatment time exceeds 30 minutes, a coarse grain is obtained, which leads to irregularities in the sputtering rate during removal of surface atoms from the surface layer (1). Such irregularities are not desirable because they lead to a non-uniform deposition on the substrate. Conversely, if the heat treatment time is less than about 1 minute, the proportion of the cured (artificially aged) aluminum-containing phases which goes into solution, is too low, resulting in a material that has a poor Brinell hardness index (HB). For example, a Brinell hardness index (HB) of 50 will not be reached after curing or artificial aging of the target, resulting in poor mechanical stability under load when employed in coating processes, such as cathodic sputtering.

It has been found that when these treatment conditions are carried out for a sufficient period of time under such heating temperatures, including subsequent quenching and curing, the conditions are suitable and useful to anneal or harden the supporting layer (2) to a Brinell hardness index (HB) of at least about 50, preferably of at least about 70, more preferably to at least about 84. Brinell hardness is an industry standard of hardness as measured conveniently, for example, by DIN 50351 with load of 613 N and ball theta of 2.5 mm.

As exemplified in the examples which follow, even higher HB hardness indices of from about 95 to about 115 have been achieved under suitable heating and curing conditions, e.g., from about 5 to about 20 minutes at a temperature from about 490° C. to about 530° C.

Desirable characteristics in the surface layer (1), such as grain cross-section (measured in square micrometers), average grain diameter (measured in micrometers), and elongation ratio have been obtained as shown by the following examples. It has been found for example, an average grain diameter of about 4 mm or less is produced in the aluminum (or aluminum alloy) surface layer (1) of a target prepared according to this invention. Preferred is an average grain diameter of about 2 mm or less. In addition, an elongation ratio of less than about 2, preferably 1, can be obtained in the aluminum surface (1) layer.

The following measurements were obtained for the surface layer (1) by carrying out the examples set forth below; grain cross-section of from about $2.37 \times 10^5 - 1.78 \times 10^6$ um$^2$ to about $1.78 \times 10^4 - 7.5 \times 10^4$ um$^2$; average grain diameter of from about 549–1,505 um to about 151–309 um; and an elongation ratio of 1. In such embodiments, particularly high Brinell hardness indices (HB) of 95 and 115 were obtained for the supporting layer (2). The uniformity and the size of the grain are particularly advantageous because these insure uniform removal of surface atoms during sputtering.

This invention further provides a method for preparing a target suitable for physical coating processes such as sputtering. This method entails heating at a temperature of from about 450° to about 550° C. the roll-bonded composite plate described above in a conventional salt bath or an air furnace for less than about 30 minutes; cooling said heated roll-bonded composite aluminum plate; and curing said cooled plate at a temperature of from about 145° to about 180° C. for a period of time of from about 2 to about 48 hours. Alternatively, the cooled plate can be naturally aged. Cooling can be carried out, for example, by quenching in cold water.

A target suitable for physical coating processes, such as cathodic sputtering and magnetron sputtering can be obtained from the composite aluminum plate described herein under this method.

The working examples set forth below are intended to illustrate the invention without limiting its scope.

EXAMPLE 1

A composite plate was prepared by roll-bonding two layers using a hot rolling mill 350 t milling force Achenbach (Buschhuetten, West Germany). One layer was 14 mm thick and consisted of a pure aluminum silicon alloy with 1% silicon (purity > 99.999%; impurities < 0.001%) melted on a pure aluminum basis (purity > 99.999%; impurities < 0.001%). A supporting layer was made from a hardenable AlMgSi alloy and was 5 mm thick. The composite plate so prepared was divided into three sections A, B and C and then treated as follows:

TABLE 1

| | TREATMENT CONDITIONS FOR PREPARING TARGET | | |
|---|---|---|---|
| Treatment | Solution Heat Treatment Time In Salt Bath | Dry Heat Treatment Time In Air Furnace | Solution Temperature |
| A | 20 min. | | 530° C. |
| B | 5 min. | | 490° C. |
| C | | 30 min. | 480° C. |

For treatments A and B, an NaNO$_3$ (melting point 230° C.) salt bath was used. The salt bath temperature range was 250° to 550° C., with a density of 1.9 kg/dm$^3$.

For treatment C, an electric furnace with motor driven fan for hot air forced convection was used (Junker AG., Simmerath, Germany). The air furnace had a rating of 35 kW's and a temperature range of 90° to 650° C., The plates were subsequently quenched in cold water and artificially cured or aged for 16 hours at 160° C.

The measurement of the Brinell hardness (HB) of the supporting layer and of the grain size in the longitudinal direction of the cross section of the surface layer are described below in Table 2.

TABLE 2

| Treatment | Grain Cross Section in Micrometers | Average Grain Diameter Micrometers | Elongation Ratio | HB Brinell Hardness* | Reference FIG. |
|---|---|---|---|---|---|
| A | $2.37 \times 10^5$–$1.78 \times 10^6$ | 549–1,505 | 1 | 115 | 2 |
| B | $1.78 \times 10^4$–$7.50 \times 10^4$ | 151–309 | 1 | 95 | 3 |
| C | $1.78 \times 10^4$–$3.16 \times 10^5$ | 151–635 | 1 | 82 | 4 |

*measured by DIN 50351 with load of 613 N and ball theta of 2.5 mm.

It can be seen from the results in Table 2 that useful aluminum composite plates and targets, prepared pursuant to this invention, can be obtained with desirable globulitic structure and having an elongation ratio of 1. Such a target is useful to withstand bombardment heating in, for example, cathodic sputtering and magnetron sputtering.

EXAMPLE 2

In this example, the three targets obtained in Example 1 were subjected to cathodic sputtering. Cathodic sputtering was carried out by using a conventional sputtering technique.

The targets exhibited good heat conductivity and mechanical stability during the course of the treatment.

EXAMPLE 3

In this example, the three targets obtained in Example 1 were subjected to magnetron sputtering. Magnetron sputtering was carried out by using a Balzers magnetron sputtering source type AR 125.

The targets exhibited good heat conductivity and mechanical stability during the course of the treatment.

What is claimed is:

1. A composite aluminum plate for making a target for coating processes, said plate comprising:
   (1) a surface layer selected from the group consisting of pure aluminum and an alloy of pure aluminum; and
   (2) a supporting layer comprising a hardenable aluminum alloy having a Brinell hardness index HB ranging from at least about 50 to about 95 under suitable heating and curing conditions.

2. The composite aluminum plate according to claim 1 wherein said (1) surface layer and said (2) supporting layer are roll-bonded.

3. The composite aluminum plate according to claim 1 wherein said pure aluminum in said (1) surface layer comprises aluminium having a purity greater than or equal to about 99.99 percent.

4. The composite aluminum plate according to claim 1 wherein the alloying elements of said alloy of aluminum in said (1) surface layer are selected from the group consisting of palladium, vanadium, samarium, zirconium, niobium, molybdenum, hafnium, tungsten, silicon, copper, titanium, chromium, and any combinations of the foregoing.

5. The composite aluminum plate according to claim 4 wherein said (1) surface layer of aluminum comprises a pure binary alloy melted on a pure aluminum basis.

6. The composite aluminum plate according to claim 4 wherein said (1) surface layer comprises a pure ternary alloy melted on a pure aluminum basis.

7. The composite aluminum plate according to claim 1 wherein said hardenable aluminum alloy in said (2) supporting layer is selected from the group consisting of AlMgSi, AlCuMg, AlMgSiCu and AlCuMnMg.

8. The composite aluminium plate according to claim 8 wherein said hardenable alloy is AlMgsi.

9. The composite aluminum plate according to claim 2 wherein said hardenable aluminum alloy in said (2) supporting layer becomes hardened upon heating at a temperature of from about 450° C. to about 550° C., for a period of time from about 3 to about 30 minutes.

10. A composite aluminum plate as defined in claim 1, wherein said surface layer (1) has a thickness of from about 8 to about 20 mm, and said supporting layer (2) has a thickness of from about 2 to about 10 mm.

11. A composite aluminum plate as defined in claim 10 wherein said supporting layer (2) comprises from about 10 to about 40% of the total thickness of said composite aluminum plate.

12. The composite aluminum plate according to claim 11 wherein said (1) surface layer and said (2) supporting layer are roll-bonded.

13. The composite aluminum plate according to claim 12 wherein said roll-bonding is carried out with a reduction ratio of at least about 20% at a temperature in the range of from about 350° to about 480° C.

14. A composite aluminum plate for making a target for coating processes, said plate comprising:
   (1) a surface layer selected from the group consisting of pure aluminum and an alloy of pure aluminum; and
   (2) a supporting layer comprising a hardenable aluminum alloy having a Brinell hardness index HB of at least about 50 to about 95 under suitable heating and curing conditions wherein said alloying element of aluminum in said surface layer (1) is silicon.

15. The composite aluminum plate according to claim 14 wherein said (2) supporting layer comprises from about 10 to about 40% of the total thickness of said composite aluminum plate.

16. The composite aluminum plate according to claim 14 wherein said (1) surface layer and said (2) supporting layer are roll-bonded.

17. The composite aluminum plate according to claim 16 wherein said roll-bonding is carried out with a reduction ratio of at least about 20% at a temperature in the range of from about 350° to about 480° C.

* * * * *